United States Patent [19]

de Bayser et al.

[11] 4,157,515

[45] Jun. 5, 1979

[54] BAND-PASS FILTERING DEVICE WITH SERVO-CONTROLLED TUNING

[75] Inventors: Pierre de Bayser; Pierre Mondoloni, both of Paris, France

[73] Assignee: Thomson-CSF, Paris, France

[21] Appl. No.: 871,799

[22] Filed: Jan. 23, 1978

[30] Foreign Application Priority Data

Jan. 28, 1976 [FR] France .................................. 77 02451

[51] Int. Cl.² .......................... H03H 7/10; H01P 1/20
[52] U.S. Cl. .................................. 333/17 R; 325/489; 333/209; 333/212
[58] Field of Search ................. 333/17 R, 73 R, 73 W; 325/159, 174, 177, 184, 187, 453, 489, 490

[56] References Cited

U.S. PATENT DOCUMENTS

| 2,976,408 | 3/1961 | Colaguori | 333/17 X |
| 3,715,690 | 2/1973 | Young et al. | 333/17 |

*Primary Examiner*—Paul L. Gensler
*Attorney, Agent, or Firm*—Cushman, Darby & Cushman

[57] ABSTRACT

Filtering device comprising a microwave band-pass filter with resonant cavities tunable by a single mechanical control shaft, an additional resonant cavity which is also controlled by this single control and which is tuned to a frequency shifted by a fixed value in relation to that of the other cavities, and a servocontrol mechanism for controlling the tuning of this additional cavity in dependence upon a frequency, for instance that of the local oscillator of a frequency converter, the simple storage of this frequency ensuring the tuning of the band-pass filter.

3 Claims, 2 Drawing Figures

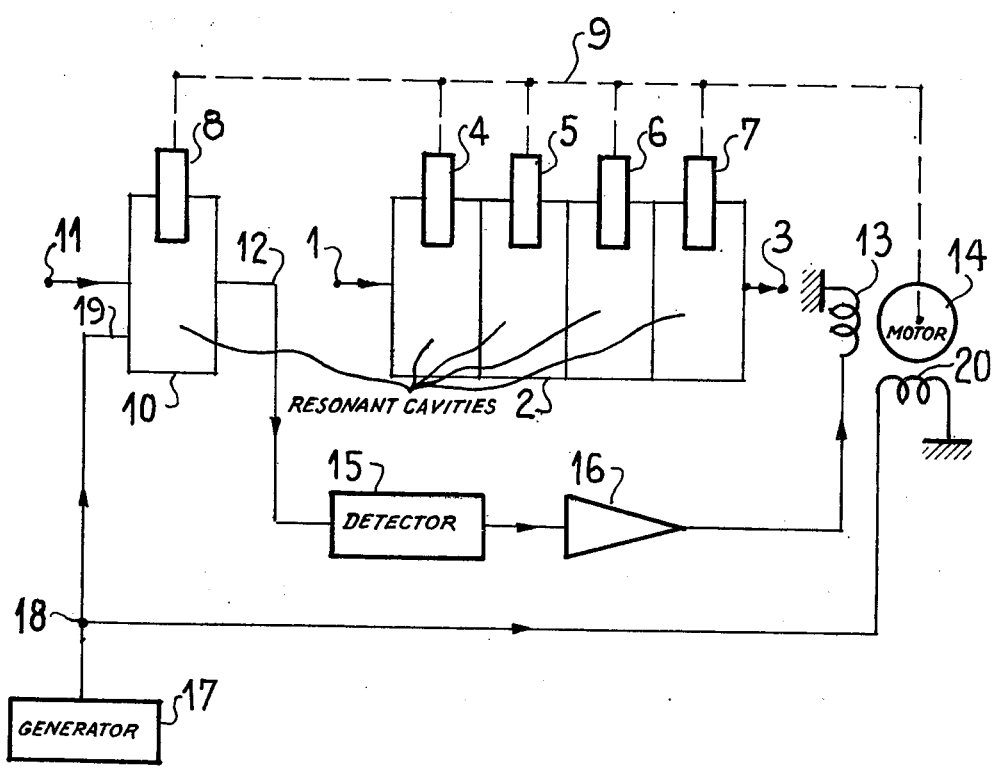

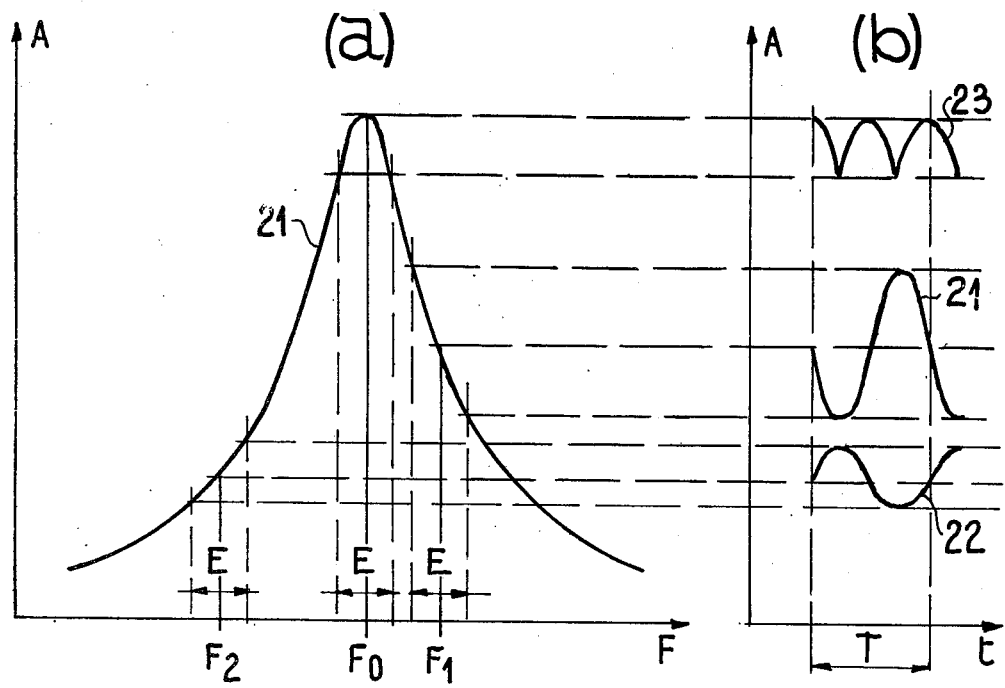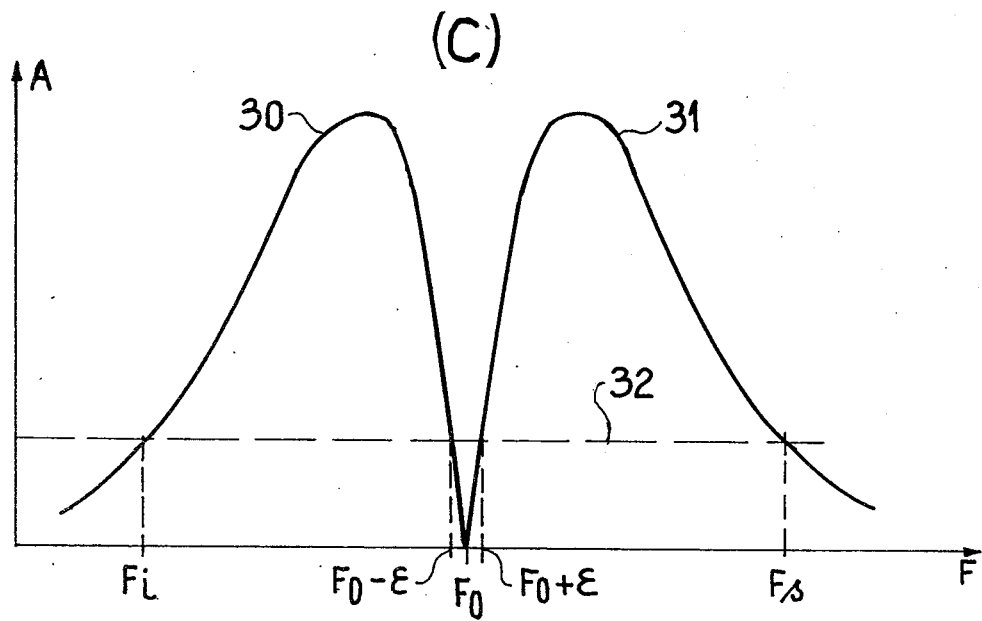

BAND-PASS FILTERING DEVICE WITH SERVO-CONTROLLED TUNING

This invention relates to band-pass filtering devices which can be rapidly frequency-tuned and, in particular, to microwave filtering devices for transmission equipments with continuous wave ranges.

Equipment of the type in question generally comprises at least one frequency converter which enables to carry out the usual selection at an intermediate frequency of fixed value. This solution involves the use of mixers and conversion oscillators. It is known to construct wide-band mixers, covering the entire tuning band envisaged, and local oscillators in the form of synthesisers which can easily be remote-controlled.

This leaves the problem of input filtering in the case of receiving equipment and output filtering in the case of generating equipment which will be referred to hereinafter by the generic term of external filtering.

It is known that this problem can be essentially resolved by means of one of the following three solutions:

1. by external fixed-tuning wide-band filtering, the equipment in question comprising a single frequency conversion. This solution is simple, but is limited in regard to the useful band width in order to avoid parasitic conversions;

2. by the same filtering as in 1, the equipment in question being provided with two frequency conversions in cascade which provides for a greater useful band width, still with fixed-tuning filtering, but unfortunately the structure is more complicated and hence expensive;

3. by external variable-tuning filtering, the equipment in question comprising a single frequency conversion. In this solution, the filter has to be tuned to each traffic frequency change. Now, it is only mechanical tuning means, particularly with variable-penetration rods, which enable resonators with good quality factor to be obtained. The resulting limitation may be offset by a single control of the various tuning elements of the filter, which still leaves an additional operation to be carried out in relation to be preceding solutions. The object of the present invention is to obviate all these drawbacks.

According to the invention, there is provided a band-pass filtering device comprising n cells, n being a positive integer, each of them having a mechanical tuning control, said n cells being electrically series connected and simultaneously tunable by means of a single control shaft mechanically coupled to the tuning controls of said n cells, said filtering device further comprising a tuning system including an additional tunable cell having an input and an output, said additional cell being substantially identical with said n cells and being tunable by said single shaft, the mechanical tuning control of said additional cell being staggered in relation to those of said n cells so as to provide a predetermined frequency interval between the resonant frequency of said additional cell and said n cells, and said tuning system further comprising a control loop which automatically positions said shaft so that said additional cell is tuned to the frequency of a signal applied to said additional cell input.

The invention will be better understood from the following description in conjunction with the accompanying drawings, wherein:

FIG. 1 shows one example of a band-pass filtering device according to the invention;

FIG. 2 shows diagrams explaining the operation of the tuning system of the device shown in FIG. 1.

In FIG. 1, the input terminal 1 receives the signals to be filtered which are applied to the input of the band-pass filter 2 and are delivered to its output terminal 3 after having passed through four series coupled resonant cavities which are respectively tuned by four variable-penetration rods 4, 5, 6 and 7 which are integrally controlled mechanically from a common shaft 9 which also controls the penetration of the rod 8 into a reference resonant cavity 10, both being technologically identical with the corresponding elements of the filter 2.

The cavity 10 receives a reference signal through an input terminal 11 and restores this signal at an output terminal 12. The output terminal 12 is connected to one of the two windings 13 of a rotating-field electrical motor 14 through a detector 15 followed by an amplifier 16. The second winding 20 of the motor 14 is fed by a generator 17 of which the output signal, delivered by the terminal 18, also feeds a second input 19 of the cavity 10. The motor 14 mechanically controls the shaft 9.

If the band-pass filter 2 is a microwave input filter of a superheterodyne receiver which has to cover the range from 6 to 7 Gc/s for example, the pass band of the filter 2 being 50 Mc/s and the pass band of the associated intermediate frequency filter being centred on 70 Mc/s, the reference frequency applied to the terminal 11 will be the output signal of a local oscillator in the form of an electrically frequency-controlled synthesiser covering the range from 5.070 to 6.070 Gc/s.

Accordingly, the cavity 10 may therefore be substantially identical with those forming the filter 2, the rod 8 being very slightly staggered in relation to those of the filter 2 in its coupling with the shaft 9 so as to maintain an interval of 70 Mc/s between the tuning of the reference cavity and the tuning of the filter.

Thus, the filter 2 will be correctly tuned when the reference cavity is resonating at the frequency of the local oscillation signal which is applied to it at its input 11.

This result is automatically obtained by the control loop comprising the elements 15, 16, 14, 9 and 8. Its operation will be explained with reference to the diagrams of FIG. 2.

In FIG. 2(a), the curve 21 represents the resonance curve of the cavity 10, i.e. in fact the amplitude of the H.F. signal delivered to the output terminal 12 in dependence upon a signal of constant amplitude and variable frequency applied to the terminal 11.

The generator 17 delivers a signal having a frequency of 400 c/s which is applied to a further input 19 of the cavity 10 by which a variable-capacitance diode which is incorporated therein, but not shown, which gives rise to a variation in the resonance frequency of this cavity at the rhythm of the amplitude of the 400 c/s signal, resulting in corresponding variations in the amplitude of the signal collected at the terminal 12.

FIG. 2(b) shows three examples of amplitude variations (curves 21, 22 and 23) respectively obtained for a local oscillation signal of frequency $F_1$, $F_2$ and $F_0$ and for the same peak-to-peak amplitude E of the 400 c/s signal during a period T of that signal.

A corresponding modulation signal is obtained at the output of the amplitude detector 15.

It can be seen that the signal obtained for a local oscillation frequency, such as $F_1$, above the resonance frequency $F_0$ is in phase opposition to the signal obtained for a frequency, such as $F_2$, below $F_0$, and that their amplitude disappears for the frequency $F_0$, the second harmonic of the modulation signal then becoming the fundamental of the collected signal.

In FIG. 2(c), two curves 30 and 31 represent the amplitude of the 400 c/s signal which appears at the terminals of the winding 13 in dependence upon the frequency of the signal applied to the terminal 11.

This signal passes through two maxima corresponding to the inflexion points situated on either side of the resonance curve 21 and through a zero at the resonance frequency $F_0$ of the cavity 10, the meeting point of the two curves 30 and 31, of which the signals which they represent are in phase opposition, as already explained above.

Since the winding 20 receives a signal of the same frequency, but in leading or lagging phase quadrature with the signal applied to the winding 13, the motor 14 will rotate in a direction characteristic of this phase shift when the amplitude of the 400 c/s signal is above a sensitivity threshold of the system represented by the straight line 32 which intersects the curve 30 for the frequencies $F_i$ and $F_o - \epsilon$ and the curve 31 for the frequencies $F_o + \epsilon$ and $F_s$.

For a given relative connection direction of the windings 13 and 20, the motor drives the rod 8 in such a way that the cavity 10 resonates at the applied frequency $F_o$ to $\pm \epsilon$, the filter 2 being simultaneously tuned to the received frequency $F_o - 70$ Mc/s, again to $\pm \epsilon$, plus a tolerance on the mechanical keying of the rods.

The tolerance $\epsilon$ may be reduced as far as desired by giving the necessary gain to the control loop and in particular by increasing that of the amplifier 16. However, a limit is imposed in this respect by the resulting increase in the inertia for avoiding the pumping effects which are common to all servo-control systems.

It has been seen that this control system will be at rest on the one hand at the required equilibrium and on the other hand for input frequencies below a limiting frequency $F_i$ and above a limiting frequency $F_s$.

This latter situation should not often arise in practice because the resonance frequency of the cavities follows the variations in the frequency of the local oscillator. After even a prolonged switching off, the drift in the resonance frequency of the cavities will normally be inadequate to leave the zone $F_s - F_i$. However, if the tuning of the local oscillator has been modified during rest periods of the equipment, it will be necessary manually to return the rods into the above zone.

It is easy to obviate this disadvantage by using a conventional automatic research system controlled by the signal issuing from a comparator receiving two items of analog information characteristic of the respective frequency positions of the local oscillator and the reference cavity, these two items of information being supplied for example by the positioning of a recopy potentiometer coupled to the control shaft and by the division order of the synthesisers supplying the local oscillation signal.

The filter has been described with reference to its use for input filtering in a receiver, although it may be used for any band-pass filtering in a wide tuning range associated with a frequency conversion and, in particular, in an transmitter comprising a mixer converting a fixed-frequency modulated signal into a variable microwave signal by means of a synthesiser, part of whose output signal is applied to the terminal 11, as in the example described, the mixer delivering the microwave signal through the filter 2.

It is clearly apparent from the foregoing that the filtering device according to the invention enables the equipment with which it is associated to operate automatically to a considerable extent because a single remote control order is sufficient to tune the equipment to the desired frequency which in particular prevents diverging orders from being sent to the various elements to be tuned in the event of a remote control failure.

On the other hand, the frequency change order is delivered to the synthesiser, a sub-assembly which is well adapted to receive it and to execute it in the absence of electromechanical intervention, the other elements to be tuned conforming to the state of the synthesiser by servocontrol.

Of course, the invention is not limited to the embodiments described and shown which were given solely by way of example.

What we claim is:

1. A band-pass filtering device comprising n cells, n being a positive integer, each of them having a mechanical tuning control, said n cells being electrically series connected and simultaneously tunable by means of a single control shaft mechanically coupled to the tuning controls of said n cells, said filtering device further comprising a tuning system including an additional tunable cell having an input and an output, said additional cell being susbstantially identical with said n cells and being tunable by said single shaft, the mechanical tuning control of said additional cell being staggered in relation to those of said n cells so as to provide a predetermined frequency interval between the resonant frequency of said additional cell and said n cells, and said tuning system further comprising a control loop which automatically positions said shaft so that said additional cell is tuned to the frequency of a signal applied to said additional cell input.

2. A band-pass filtering device as claimed in claim 1 wherein said control loop further comprises: a two phase rotating-field motor having a first and a second winding; an amplitude detector having an input, and being series connected with an amplifier having an output; and a low frequency generator having an output; said additional cell including means for electrically sweeping its tuning frequency, said means having a signal input; said output generator being connected in parallel to said signal input and to said first winding, said additional cell output being connected to said demodulator input and said second winding being connected to said amplifier output.

3. A band-pass filtering device as claimed in claim 2 wherein said n cells are microwave resonant cavities and said sweeping means comprises a variable capacitance diode.

* * * * *